United States Patent [19]

Haenen et al.

[11] 3,849,735

[45] Nov. 19, 1974

[54] WIDE-BAND DIFFERENTIAL AMPLIFIER

[75] Inventors: Henricus Wijnandus Gerardus Haenen; Bernardus Josephus Marie Overgoor, both of Emmasingel, Eindhoven, Netherlands

[73] Assignee: U.S. Philips Corporation, New York, N.Y.

[22] Filed: Sept. 24, 1973

[21] Appl. No.: 400,395

Related U.S. Application Data

[63] Continuation of Ser. No. 241,203, April 5, 1972, abandoned.

[30] Foreign Application Priority Data

Apr. 7, 1971 Netherlands ....................... 7104636

Aug. 14, 1971 Netherlands ....................... 7111226

[52] U.S. Cl. ............................... 330/30 D, 328/160

[51] Int. Cl. ............................................. H03f 3/68

[58] Field of Search ................. 330/30 D, 69, 38 M; 328/160

[56] References Cited

UNITED STATES PATENTS 3,689,752 9/1972 Gilbert ........................... 328/160 X

*Primary Examiner*—Herman Karl Saalbach

*Assistant Examiner*—James B. Mullins

*Attorney, Agent, or Firm*—Frank R. Trifari; Henry I. Steckler

[57] ABSTRACT

Wide-band differential amplifier comprising two transistors connected as a differential pair and two input elements having logarithmic characteristics for converting the input currents supplied to them into a difference voltage for the transistors connected as a differential pair. This difference voltage is applied to the base electrodes of these transistors via a follower circuit having an adjustable bias-current setting so that the level shift between the input elements and the transistors of the differential pair is adjustable.

6 Claims, 7 Drawing Figures

WIDE-BAND DIFFERENTIAL AMPLIFIER

Figure 1:
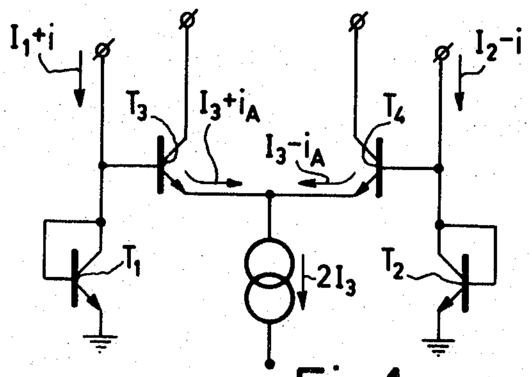
Fig.1 PRIOR ART

This is a continuation of application Ser. No. 241,203, filed Apr. 5, 1972, and now abandoned.

The invention relates to a differential amplifier which comprises two transistors connected as a first differential pair and a pair of input elements, having logarithmic characteristics which mainly correspond to that of a semiconductor junction, for converting an input difference current supplied to these input elements into a difference voltage which is applied to the base electrodes of the transistors of the first differential pair.

Such a differential amplifier is described in I.E.E.E. Journal of Solid-State Circuits, Vol. sc—3, No. 4, December 1968, pages 353 sqq. When designing the differential amplifier described in this paper the object was to realize an amplifier which is particularly suited to be manufactured in integrated circuit form and has both a wide-bandwidth and a satisfactory linearity of the amplification.

The suitability for being made in integrated circuit form of the differential amplifier described is obtained owing to the absence of passive elements which are required in most amplifier circuits to fix the gain and to improve the linearity. A wide bandwidth is obtained in that current gain without perceptible voltage swing is used, so that the parasitic capacitances which are produced in integrated circuits result in only a slight limitation of the bandwidth.

The linearity of the gain is largely determined by the accuracy with which the transistors can be manufactured in integrated circuit form. As will be shown more fully hereinafter with reference to the figures, the differential amplifier described in the aforementioned paper enables a distortion-free gain to be achieved only if the transistors used are closely matched, that is to say if they have equal saturation currents, emitter bulk resistances, base resistances and Miller capacitances. Obviously this is not completely obtainable by means of the present manufacturing techniques. The main cause of aberrations is the difference in saturation currents owing to discrepancies between the emitter areas of the various transistors.

Hence, if the amplifier circuit described it to achieve a highly linear gain, care must be taken to ensure that the transistors are as closely matched as possible by using extremely accurate integration techniques. It will be clear that this entails a great increase in cost. Furthermore, each discrepancy between the transistors will result in distortion, so that if in manufacture stringent requirements are to be satisfied in this respect the proportion of rejects will be high.

It is an object of the present invention to provide a differential amplifier which enables a highly linear gain to be obtained without the aforementioned stringent requirements with respect to equality of the transistors having to be satisfied. It will be appreciated that such an amplifier has a very wide field of application and may be used, for example, as a grounded or floating potentiometer, as a multiplier, as a modulator or a synchronous detector, and so on. In general the amplifier may be used whereever a current gain which is linearly dependent upon another current is desired.

The invention is characterized in that the difference voltage is applied to the transistors of the first differential pair via a first follower circuit having an adjustable bias-current setting so that the level shift between the input elements and the transistors of the differential pair is mutually adjustable.

An essential advantage of the differential amplifier according to the invention is the fact that by means of the adjustable bias-current setting of the follower circuit the differential amplifier may be balanced and that by doing this the distortion due to inequalities of the transistors is eliminated at the same time. This is in contrast with the known differential amplifier in which, although balance adjustment may be effected by adjusting the two input direct-currents, this adjustment does not eliminate the said distortion.

The distortion due to the base currents produced owing to the finite values of the current gain factors of the transistors still plays a part in the differential amplifier according to the invention. However, the resulting distortion is small and may be further reduced in the differential amplifier according to the invention by a suitable choice of the absolute values of the bias currents in the follower circuit.

In a first embodiment of the differential amplifier according to the invention, the follower circuit comprises two transistors connected as emitter followers which each are included in the connection between one of the input elements and one of the transistors of the differential pair, each of the transistors connected as emitter followers being supplied with bias current by an associated current source, at least one of the current sources being adjustable. Balance adjustment of the differential amplifier thus is effected by varying the adjustment of the adjustable current source.

In a second embodiment of the differential amplifier according to the invention the follower circuit comprises two transistors the emitters of which are connected to one another and to a current source and the collector circuits of which include a regulating element which enables the ratio between the bias currents passed by the transistors to be adjusted, the base of one of these transistors being connected to an input element and the base of the other transistor being connected to a transistor of the differential pair. Balance adjustment of the differential amplifier here is effected by regulating the bias currents passed by the two transistors of the follower circuit by means of the regulating element.

Figure 2:
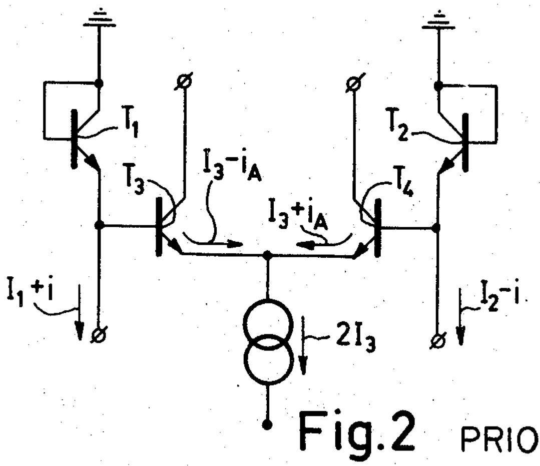
Fig.2 PRIOR ART
Figure 3:
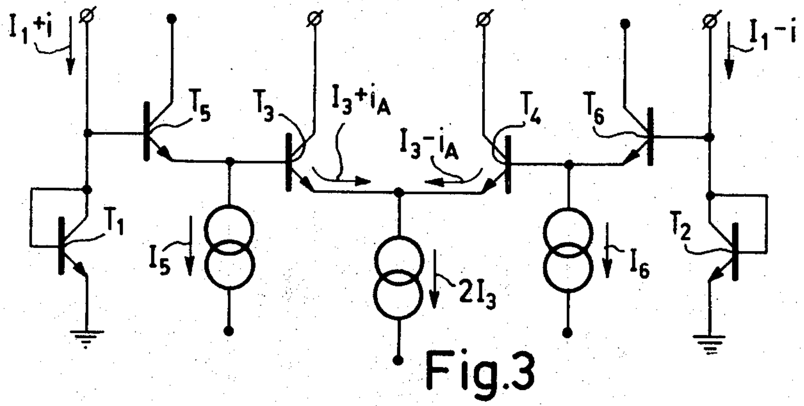
Figure 5:
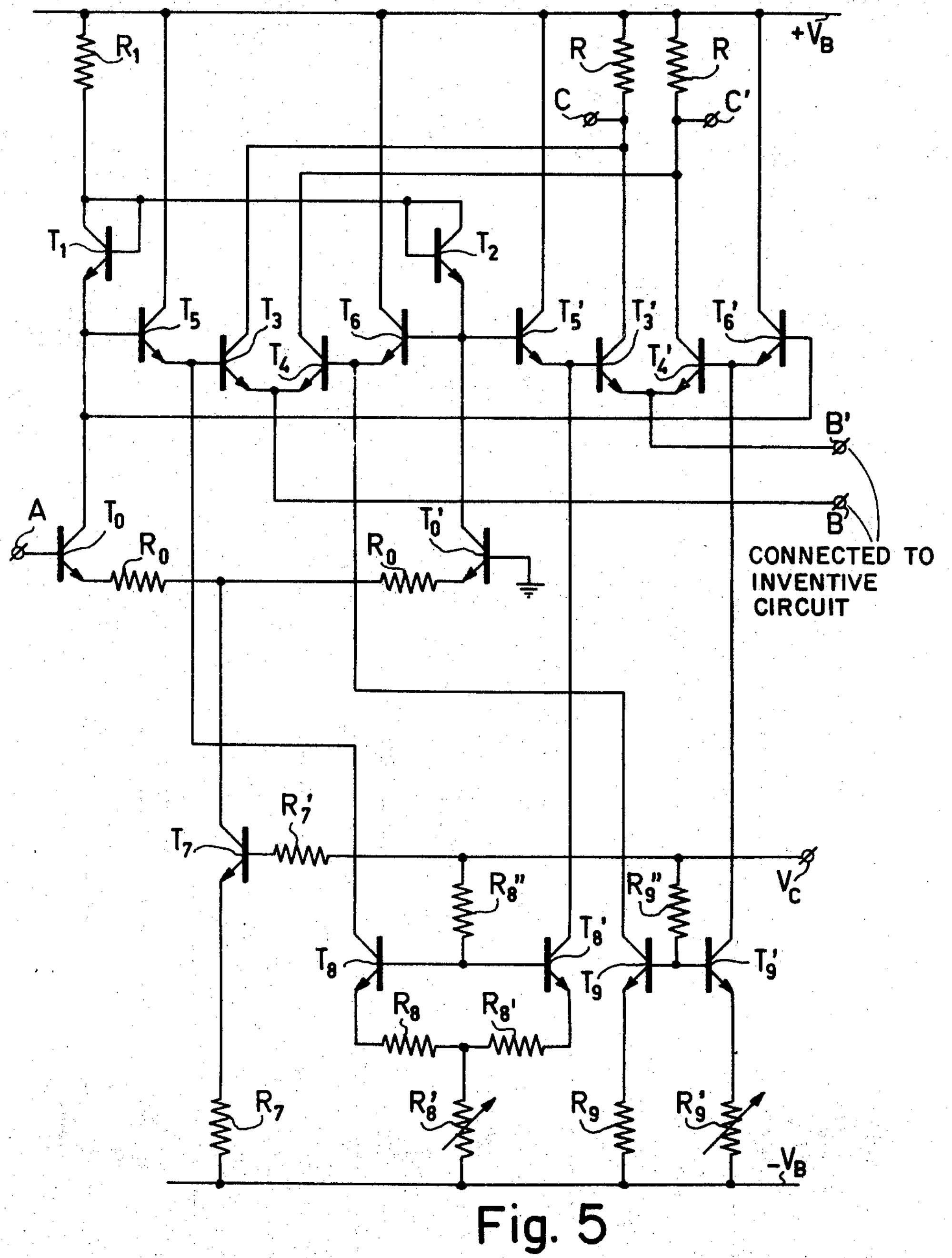
Figure 4:
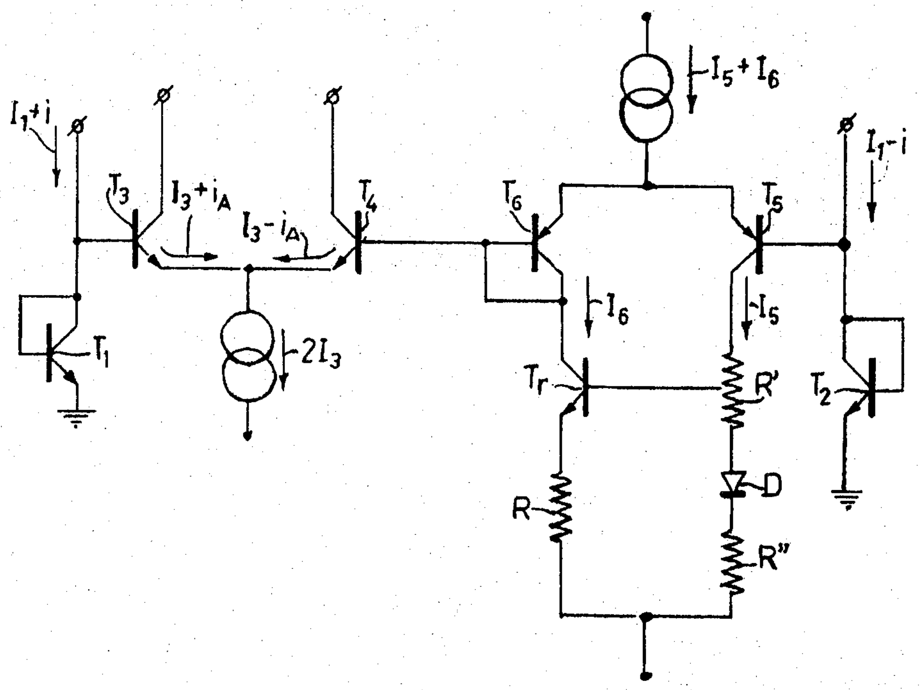
Figure 6:
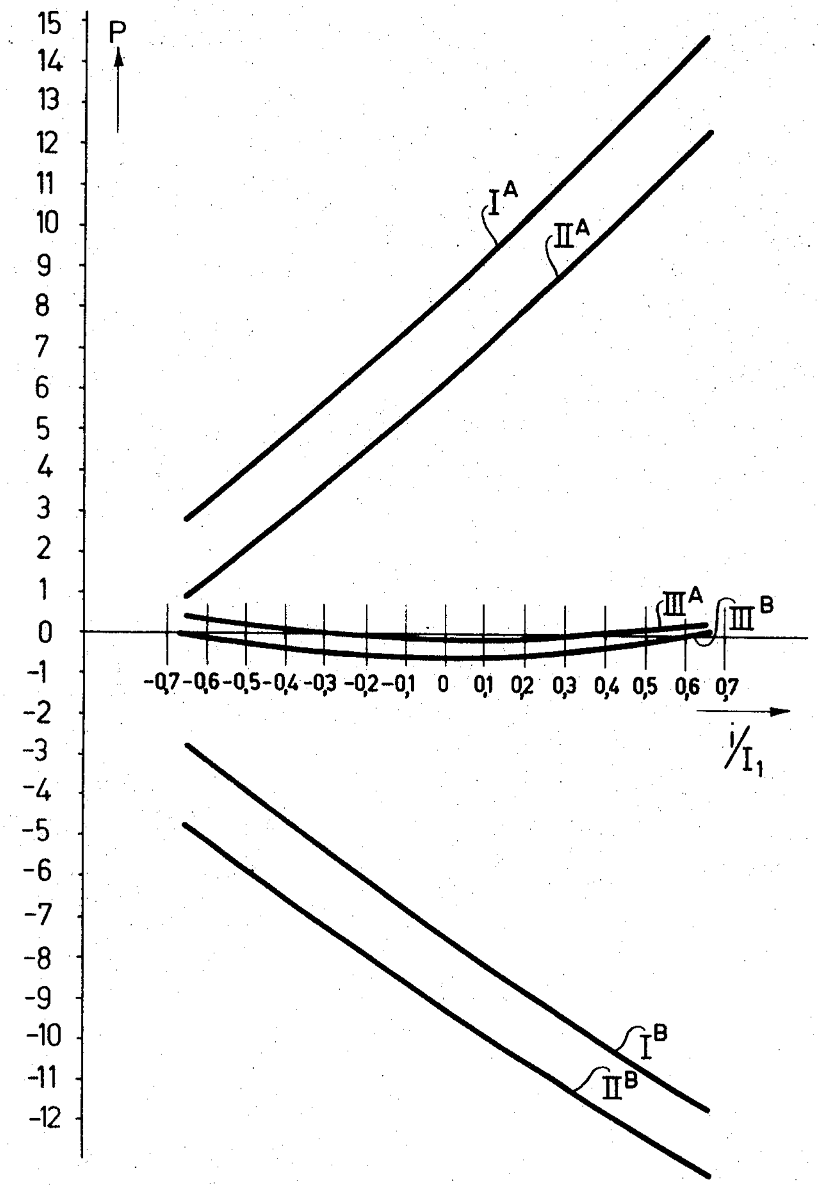
Figure 7:
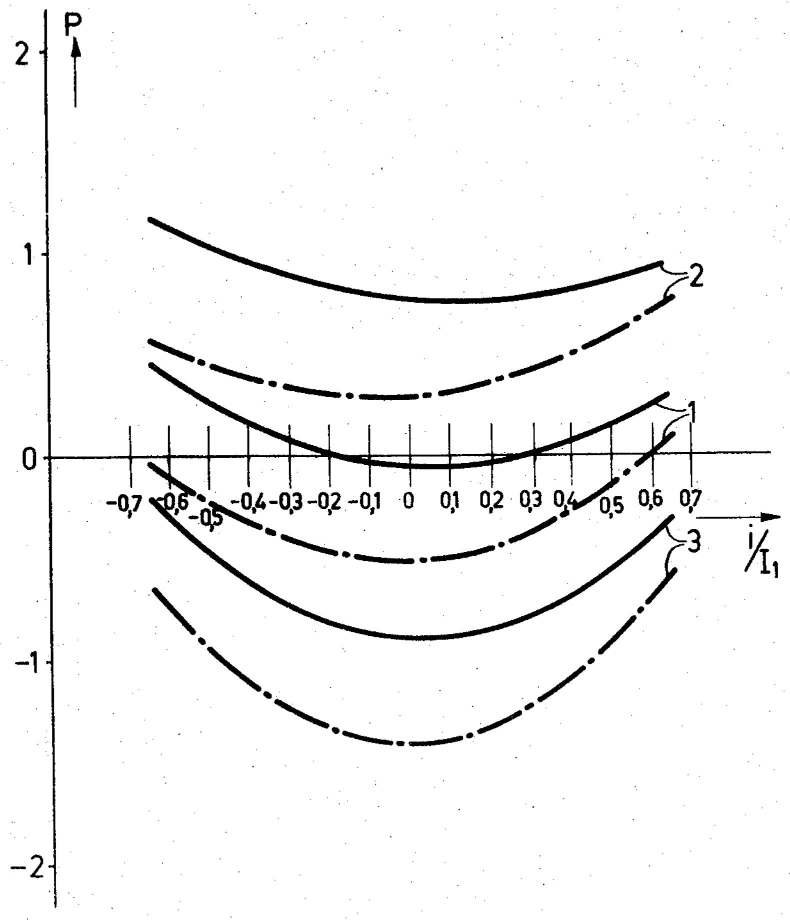

Embodiments of the invention will now be described, by way of example, with reference to the accompanying diagrammatic drawings, in which:

FIG. 1 shows a first embodiment of the differential amplifier described in the aforementioned paper, FIG. 2 shows a second embodiment thereof, FIG. 3 shows a first embodiment of a differential amplifier according to the invention and FIG. 4 shows a second embodiment thereof, FIG. 5 shows a multiplier circuit composed of two differential amplifiers according to the invention, FIG. 6 shows characteristic curves of the circuit according to the invention compared with those of the known circuits, FIG. 7 shows characteristic curves of the circuit according to the invention as functions of the absolute values of the current sources.

FIG. 1 shows a differential amplifier as described in the said paper which includes transistors $T_3$ and $T_4$ which are connected as a differential pair and the emitters of which are connected to a current source $2I_3$. The control voltages for these transistors $T_3$ and $T_4$ are obtained by means of two transistors $T_1$ and $T_2$ which are connected as diodes and each have one electrode connected to a point of constant potential and another electrode connected to the base of one of the transistors $T_3$ and $T_4$, the input signals in the form of input currents being applied to these transistors $T_1$ and $T_2$. The output signals of the differential amplifier may be derived from the collectors of the transistors $T_3$ and $T_4$ in the form of output currents. These output currents may obviously be converted into output voltages by including impedances in the said collector circuits.

To illustrate the operation of the differential amplifier it is assumed that an input current $I_1 + i$ is supplied to the transistor $T_1$ and an input current $I_2 - i$ is supplied to the transistor $T_2$, where $I_1$ and $I_2$ are direct-current components and $i$ is the alternating component which consequently is applied in push-pull. The direct-current components of the input currents have been made unequal to enable the amplifier to be adjusted in balance, as will appear from the following.

Owing to the input current $I_1 + i$ there will be produced across the transistor $T_1$ a voltage equal to $kT/q \ln I_1 + i/I_{s1}$, where $I_{s1}$ is the saturation current of the transistor $T_1$, $T$ is the absolute temperature, $k$ is Boltzmann's constant and $q$ is the elementary charge. To simplify the computation it is assumed that the transistor $T_3$ has an infinite current gain factor so that its base current is zero. Similarly, the voltage across the transistor $T_2$ may be written $$kT/q \ln I_2 - i/I_{s2}$$

where $I_{s2}$ is the saturation current of the transistor $T_2$, whilst for the base emitter voltages $V_{be3}$ and $V_{be4}$ of the transistors $T_3$ and $T_4$ respectively we have $$V_{be3} = kT/q \ln I_3 + i_A/I_{s3}$$

and $$V_{be4} = kT/q \ln I_3 - i_A/I_{s4}$$

respectively, where $I_{s3}$ and $I_{s4}$ are the saturation currents and $I_3 + i_A$ and $I_3 - i_A$ are the emitter currents of the transistors $T_3$ and $T_4$ respectively. For the entire circuit there is the requirement that the voltage across the transistor $T_1$ less the base emitter voltage of the transistor $T_3$ should be equal to the voltage across the transistor $T_2$ less the base emitter voltage of the transistor $T_4$; so:

$$kT/q \ln (I_1 + i)/I_{s1} - kT/q \ln I_3 + i_A/I_{s3}\ kT/q \ln (I_2 - i)/I_{s2} - kT/q \ln I_3 - i_A/I_{s4} \quad (1).$$

From this equation we get for $i_A$:

$$I_A = I_3\ I_1 - I_{s1}I_{s4}/I_{s2}I_{s3}\ I_2 + i\ (1 + I_{s1}I_{s4}/I_{s2}I_{s3})/I_1 + I_{s1}I_{s4}/I_{s2}I_{s3}\ I_2 + i\ (1 - I_{s1}I_{s4}/I_{s2}I_{s3}) \quad (2).$$

By adjusting the bias current setting $I_2$ with respect to $I_1$ the differential amplifier may be balanced. The amplifier is balanced if for $i = 0$ the current $i_A$ is zero. Thus the balance condition can be found by substituting $i = 0$ in the equation (2) and to require the result $i_A = 0$. Thus we find as the balance condition $$I_2/I_1 = I_{s2}I_{s3}/I_{s1}I_{s4} \quad (3).$$

As has been mentioned hereinbefore, this balance condition may be satisfied by adjusting either of the bias current settings $I_1$ and $I_2$. Assuming this balance condition to be satisfied, substitution of (3) in (2) results in a current $i_A$:

$$i_A = I_3\ i(1 + I_{s1}I_{s4}/I_{s2}I_{s3}/2I_1 + i(1 - I_{s1}I_{s4}/I_{s2}I_{s3}) \quad (4).$$

The last equation shows that in spite of the fact that the differential amplifier has been balanced distortion occurs owing to the term in the numerator including $i$. Distortion-free amplification is obtained only if $$I_{s1}\ I_{s4}/I_{s2}\ I_{s3} = 1 \quad (5).$$

for then the said term including $i$ in the numerator in equation (4) is eliminated. Attempts will be made to achieve this condition by matching all the transistors as closely as possible. When the equation (5) is satisfied, the desired output current is $$i_{A0} = i\ I_3/I_1 \quad (6).$$

In the present state of the art of manufacturing integrated circuits by mass production methods transistors can be made in which the relative differences between the saturation currents are less than 8 percent. Taking into account this maximum difference the expression of equation (5) becomes $$0.85 \leq I_{s1}\ I_{s4}/I_{s2}\ I_{s3} \leq 1.17 \quad 7.$$

To give an impression of the distortion due to the inequality of the transistors FIG. 6 shows the relative discrepancy P of the output current with reference to the desired current as a function of the input current $i$ $$P = i_A - i_{A0}/i_{A0} \times 100\% \quad 8.$$

In this figure the line $I^A$ shows the relative difference when $$I_{s1}\ I_{s4}/I_{s2}\ I_{s3} = 1.17$$

and the line $I^B$ shows the relative difference when $$I_{s1}\ I_{s4}/I_{s2}\ I_{s3} = 0.85$$

It should be noted that alternating voltage signals are concerned and that the value at $i = 0$ has been obtained by determining the limiting value for $i \to 0$.

The graph shows that this inequality of the transistors still may give rise to appreciably distortion, which is greatest at maximum positive driving, which has been assumed to be $i = 0.85\ I_1$.

In the preceding calculation no account has been taken of the base currents which are produced owing to the finite current gain factors of the transistors. However, it has been found that these base currents have a negligible influence on the linearity of the gain, as has been shown in the aforementioned paper.

The above does not apply to the circuit shown in FIG. 2. This circuit largely corresponds to that shown in FIG. 1 with the difference that the transistors $T_1$ and $T_2$ connected as diodes have been given different positions. The operation of this circuit is identical with that of the circuit shown in FIG. 1, however, owing to the different positions of the transistors $T_1$ and $T_2$ the phases of the output currents have been interchanged.

The circuit shown in FIG. 2 is to be preferred to that shown in FIG. 1 because a correct combination of the input and output current enables an additional gain to be obtained, for this circuit provides the possibility of not connecting the transistors $T_1$ and $T_2$ as diodes but of connecting their bases to a point of fixed potential. Connecting the collectors of the transistors $T_1$ and $T_2$ to the collectors of the transistors $T_4$ and $T_3$ respectively results in that the input currents are added to the output currents in the correct phases, so that additional gain is obtained. Furthermore the output currents obtained may directly be used as input currents for a following identical amplifier circuit, permitting a plurality of amplifier circuits as shown in FIG. 2 to be connected in cascade in a very simple manner.

A calculation corresponding to that made with reference to FIG. 1 again shows that distortion is produced by the inequality of the transistors. In contradistinction to the circuit shown in FIG. 1 the circuit shown in FIG. 2 gives rise to an additional deviation from a desired behaviour owing to the finite current gain factor of the transistors, for in this circuit the emitter currents of the transistors $T_1$ and $T_2$ each are the sum of the relevant input current and the base current of the associated one of the transistors $T_3$ and $T_4$, whilst at the input to which the smaller input current is supplied the larger base current from the associated transistor of the differential pair appears owing to the phase inversion between the input and the output of the circuit. It can be shown that owing to the finite values of the current gain factors of the transistors the linearity of the circuit is impaired with equal maximum drive at the inputs and equal gain of the circuits. In FIG. 6 (curves IIA and IIB) the relative deviation P of the output current has again been plotted as a function of the input current for the said two limiting values of the transistor discrepancies, assuming the current gain factor $\beta$ of the transistors to be 100.

FIG. 3 shows a first embodiment of the amplifier circuit according to the invention. This differential amplifier according to the invention again includes transistors $T_3$ and $T_4$ connected as a differential pair and having their emitters connected to a current source $2I_3$, whilst the output currents may be derived from the collectors. The differential amplifier further again comprises two transistors $T_1$ and $T_2$ connected as diodes and serving to convert the input currents into control voltages for the differential pair $T_3$ and $T_4$. However, in contradistinction to the known circuits these control voltages are applied to the base electrodes of the transistors $T_3$ and $T_4$ not directly but via transistors $T_5$ and $T_6$ which are connected as emitter followers and to which quiescent currents $I_5$ and $I_6$ respectively are supplied by direct current sources.

In order to enable the resulting distortion to be calculated it is assumed that the input currents supplied to the transistors $T_1$ and $T_2$ are $I_1 + i$ and $I_1 - i$ respectively. In contradistinction to the calculation with reference to FIG. 1 the direct-current components of the two input currents are here assumed to be equal, because the balance adjustment is not effected by adjustment of one of these direct-current components but by adjustment of one of the current sources $I_5$ and $I_6$, as will be seen from the following discussion. The emitter currents of the transistors $T_3$ and $T_4$ have again been assumed to be $I_3 + i_A$ and $I_3 - i_A$ respectively.

In analogy with the calculation with reference to the circuit of FIG. 1, equation of the voltage between the emitter of the transistor $T_1$ and the emitter of the transistor $T_3$ to the voltage between the emitter of the transistor $T_2$ and the emitter of the transistor $T_4$, whilst neglecting the base currents, again enables an expression for the component $i_A$ of the output currents to be found, namely $$i_A = I_3\,[I_1(I_6 - I_{s1}\,I_{s4}\,I_{s6}/I_{s2}\,I_{s3}\,I_{s5}I_5) + i\,(I_6 + I_{s1}\,I_{s4}\,I_{s6}/I_{s2}\,I_{s3}\,I_{s5}\,I_5)]/[I_1(I_6 + I_{s1}\,I_{s4}\,I_{s6}/I_{s2}\,I_{s3}\,I_{s5}\,I_5) + i\,(I_6 - I_{s1}\,I_{s4}\,I_{s6}/I_{s2}\,I_{s3}\,I_{s5}\,I_5)] \quad 9.$$

The condition for balance again is that $i_A$ must be equal to 0 when $i=0$, and substitution thereof in (9) provides the condition $$I_5/I_6 = I_{s2}\,I_{s3}\,I_{s5}/I_{s1}\,I_{s4}\,I_{s6} \quad 10.$$

Thus the differential amplifier may be adjusted in balance by adjustment of one of the current sources $I_5$ or $I_6$. After this balance adjustment substitution of (10) into (9) gives the output current:

$$i_A = I_3/I_1\,i \quad 11.$$

This expression for the output current $i_A$ shows that the distortion due to the inequality of the transistors has completely be eliminated. Consequently, in contradistinction to the known circuit in the amplifier according to the invention balance adjustment also provides complete elimination of the distortion due to the inequality of the transistors.

The overall distortion is not entirely zero, because in the circuit according to the invention owing to the finite values of the current gain factors of the transistors the base currents of the transistors still cause distortion. However, this distortion is considerably smaller than the distortion which might be produced by the inequality of the transistors, as will be set out hereinafter.

When in the calculation of the alternating-current component $i_A$ of the output current the base currents are allowed for, after the introduction of the balance condition a third-order equation is obtained for this output current $i_A$. It is found that the relative deviation of the value of the output current $i_A$ found from this equation from the desired value depends upon the values of the current sources $I_5$ and $I_6$ relative to the current sources $I_1$ and $2I_3$. When the absolute values of the current sources are set to the optimum, the relative deviation P is particularly small, as is clearly shown by the curves $III^A$ and $III^B$ of FIG. 6.

It has been found that an optimum value for the current sources $I_5$ and $I_6$ can be found at which the resulting distortion of the output current is very small, as is apparent from the curves. Consequently by selecting one of the current sources $I_5$ and $I_6$ so as to have an optimum value and by adjusting the other current source until the balance condition is satisfied, a substantially distortion-free amplification is obtained irrespective of the inequality of the transistors.

The dependence of the maximum relative deviation P upon the choice of the absolute values of the current sources is clearly shown by the curves of FIG. 7. The full lines show the characteristics for $$I_{s1}\,I_{s4}\,I_{s6}/I_{s2}\,I_{s3}\,I_{s5}=0.794$$

and the dot-dash lines show the characteristics for $$I_{s1}\,I_{s4}\,I_{s6}/I_{s2}\,I_{s3}\,I_{s5}=1.26$$

where it has again been assumed that $\beta = 100$. The curves 1 show the relative deviation P for the case that the current source $T_6$ has the optimum value. It has been assumed that $I_6$ has a fixed value and that balance adjustment is effected by means of $I_5$. Hence these curves correspond to the curves $III^A$ and $III_B$ of FIG. 6.

The curves 2 and 3 show the relative deviation P for the cases in which $I_6 = 1.5$ times the optimum value and the optimum value divided by 1.5 respectively. It will be apparent that owing to the deviation of the current source $I_6$ from the optimum value the relative deviation P has increased, however, it still is appreciably smaller than the deviations which occur in the known circuits.

It should be noted that the two curves 1, i.e., the curves for the two limiting values of the transistor deviations, merge to form one curve if, depending on the sign of the transistor deviation ($I_{s1}\,I_{s4}\,I_{s6}/I_{s2}\,I_{s3}\,I_{s5}$ greater or amaller than unity), the balance adjustment is effected by adjustment of either $I_6$ or $I_5$.

The circuit according to the invention has the further advantage that even when the transistors $T_1$ and $T_2$ connected as diodes are placed in positions corresponding to those of FIG. 2 the distortion is considerably smaller than in the known circuit, so that this configuration may be used to obtain greater gain, for in this case the base of the transistors $T_1$ and $T_2$ may again be connected to a point of constant potential and the collector currents may again be added crosswise to the output currents of the differential amplifier.

FIG. 4 shows a second embodiment of the differential amplifier according to the invention. The follower circuit comprises transistors $T_5$ and $T_6$ of the pnp type the emitters of which are connected to a current source ($I_5 + I_6$). The base of the transistor $T_5$ is connected to the transistor $T_2$, and the base of the transistor $T_6$, which is connected as a diode, is connected to the base of the transistor $T_4$. The collector circuits of the transistors $T_5$ and $T_6$ include a regulating element which enables the ratio between the transistor direct currents $I_5$ and $I_6$ to be adjusted. This regulating element comprises a transistor $T_r$ the collector emitter path of which is included in series with a resistor R in the collector circuit of the transistor $T_6$, and the series combination of two resistors R' and R'' and a diode D, which series combination is included in the collector circuit of the transistor $T_5$. The base of the transistor $T_r$ is connected to a tapping on the resistor R'. This regulating element ensures that the currents $I_5$ and $I_6$ are in a fixed ratio to one another which is adjustable by shifting the tapping on the resistor R'.

For the component $i_4$ of the output currents the expression (9) is again found, so that it will be appreciated that the amplifier may again be adjusted in balance by varying the current ratio $$I_5/I_6$$

by means of the regulating element, with the result that again the distortion due to the inequality of the transistors is completely eliminated.

Furthermore it will be clear that a wide variety of the follower circuits may be used. For example, instead of pnp transistors ($T_5$ and $T_6$) npn transistors may be used, in which case the regulating element must obviously be correspondingly adapted. This regulating element also may be designed in a large number of manners.

FIG. 5 shows a 4-quadrant multiplier built up in a generally known manner from two differential amplifiers according to the invention which comprise transistors $T_3$, $T_4$, $T_5$, $T_6$ and $T_3'$, $T_4'$, $T_5'$, $T_6'$ respectively. The bases of the transistors $T_6$ and $T_5'$ are connected to one another as are the bases of the transistors $T_5$ and $T_6'$. The collectors of the transistors $T_3$ and $T_3'$ are also interconnected as are the collectors of the transistors $T_4$ and $T_4'$. The input elements for the first input signal take the form of two transistors $T_1$ and $T_2$ which are connected as diodes and each have one electrode connected to the bases of the transistors $T_5$ and $T_6'$ and to the bases of the transistors $T_5'$ and $T_6$ respectively, their other electrodes being connected through a resistor $R_1$ to a positive terminal $+V_B$ of the voltage supply.

The complementary input currents, which correspond to the first input signal, are supplied to the transistors $T_1$ and $T_2$ by means of two transistors $T_0$ and $T_0'$ which are connected as a differential pair and the emitters of which each are connected through a resistor $R_0$ to a current source ($T_7$, $R_7$, $R_7'$). The first input voltage may be applied to the base of the transistor $T_0$, whilst the base of the transistor $T_0'$ may be connected to a point of fixed potential, for example ground.

The complementary input currents which correspond to the second input voltage are supplied to terminals B and B' which are connected to the emitters of the transistors $T_3$ and $T_4$ and to the emitters of the transistor $T_3'$ and $T_4'$ respectively. Obviously this may be effected similarly to the first input voltage by means of two transistors connected as a differential pair. However, preferably there is used for this purpose a third differential amplifier according to the invention the output currents are supplied to the terminals B and B'. Thus the influence of the in-phase component (common-mode signal) of the second input signal on the behaviour of the multiplier circuit is greatly reduced.

The output voltage may be derived from one of the resistors R included in the collector leads of the transistors $T_3$, $T_3'$, $T_4$ and $T_4'$, i.e., from one of the terminals *c* and *c'*. Naturally the output voltage may also be derived in push-pull from the terminals *c* and *c'*. The current sources for the transistors $T_5$, $T_5'$, $T_6$ and $T_6'$ connected as emitter followers take the form of transistors $T_9$, $T_8'$, $T_8$ and $T_9'$ the bases of which are connected through resistors to a point of constant potential. Because only two degrees of freedom are required for a correct setting of the multiplier circuit, two current sources, $T_8$ and $T_8'$, are combined so that the transistors $T_6$ and $T_5'$ have currents supplied to them which are in a fixed ratio, preferably of unity, to one another. These two currents may be adjusted by means of a variable resistor $R_8'$ connected in the tail of the differential pair $T_8$ and $T_8'$. The current for the transistor $T_6'$ may be adjusted by means of a variable resistor $R_9'$ connected in the emitter circuit of the transistor $T_9'$. The current for the transistor $T_5$ is not adjustable but is previously set to the aforementioned optimum value by selecting the value of a resistor $R_9$.

Correct setting of the multiplier may, for example, be effected as follows. First an input signal is applied to an input terminal A only, after which the resistor $R_9'$ is varied until the output signal, that is the alternating-voltage signal at one of the terminals $c$ and $c'$, is zero. Then a balanced input signal is applied to the terminals B and B' only, and subsequently the output signal is again adjusted to zero by means of the variable resistor $R_8'$. Thus a unique setting of the multiplier is achieved.

When a third differential amplifier according to the invention is used to supply the balanced currents to the terminals B and B' a third adjustment is required which may be effected by adjusting one of the current sources of this third differential amplifier. Separate application of one of the input signals and adjustment of the current sources in the correct sequence again enables unique setting of the multiplier.

What is claimed is:

1. A circuit comprising a differential amplifier including a first differential pair of transistors having at least some difference in their conduction characteristics and a first pair of input elements means coupled to the bases of said transistors respectively for converting an input difference current into a difference voltage for application to said bases, said input elements having logarithmic conduction characteristics substantially corresponding to that of a semiconductor junction; a first follower circuit coupled between at least one of said elements and said respective base; and means for eliminating the effects of said transistor conduction characteristics difference comprising means coupled to said follower circuit for adjusting a bias current thereof.

2. A circuit as claimed in claim 1 wherein said follower circuit comprises a second pair of transistors coupled as emitter followers between said elements respectively and said transistors of said first pair respectively, a pair of current sources coupled to said transistors of said second pair respectively, said adjusting means comprising at least one of said current sources being adjustable.

3. A circuit as claimed in claim 1 wherein said first follower circuit comprises a second pair of transistors, each having emitter, base, and collector electrodes, said emitters being coupled together; a current source coupled to said emitters; said adjusting means comprising a regulating element means coupled to said collectors for adjusting the ratio of the bias currents thereof; one of said bases being coupled to said input element, the remaining base being coupled to the base of one of said transistors of said first pair.

4. A circuit as claimed in claim 3 wherein said transistors of said second pair have the same conductivity type, said regulating element comprising a transistor having an opposite conductivity type and an emitter-collector path coupled to the collector one of said second pair transistors; and means coupled to the remaining transistor collector and the base-emitter junction of said regulating transistor for setting the baseemitter junction voltage of said regulating transistor in accordance with the collector current of the remaining transistor of said second pair.

5. A circuit as claimed in claim 1 further comprising a second differential pair of transistors; a second follower circuit coupled between said elements and the bases of said second transistor pair, the collectors of said second transistor pair being cross-coupled to the collectors of said first pair, means for supplying a first signal difference current to said elements; and means for supplying a second signal difference current to the emitter electrodes of both of said pairs; whereby said circuit comprises a four quadrant multiplier.

6. A circuit as claimed in claim 5 wherein said last recited supplying means comprises a third differential transistor pair having at least some difference in their conduction characteristics and a second pair of input elements means coupled to the bases of said third transistor pair respectively for converting said second signal input difference current into a difference voltage for application to said bases, said second input elements having logarithmic conduction characteristics substantially corresponding to that of a semiconductor junction; a third follower circuit having a pair of transistors coupled between said elements respectively and said respective bases.

* * * * *